United States Patent
Cronin et al.

(12) 
(10) Patent No.: US 6,734,564 B1
(45) Date of Patent: May 11, 2004

(54) SPECIALLY SHAPED CONTACT VIA AND INTEGRATED CIRCUIT THEREWITH

(75) Inventors: John Edward Cronin, Milton, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 699 days.

(21) Appl. No.: 09/225,116

(22) Filed: Jan. 4, 1999

(51) Int. Cl.$^7$ .......................... H01L 23/48; H01L 23/52
(52) U.S. Cl. ........................................ 257/774; 257/773
(58) Field of Search ................... 257/758, 762, 257/763, 773, 774, 775, 776, 751, 752; 438/637, 638, 639, 640, 666, 668

(56) References Cited

U.S. PATENT DOCUMENTS

| | | | |
|---|---|---|---|
| 4,474,831 A | 10/1984 | Downey | 438/800 |
| 4,781,945 A | 11/1988 | Nishimura et al. | 438/783 |
| 4,835,597 A | 5/1989 | Okuyama et al. | 257/634 |
| 4,962,063 A | 10/1990 | Maydan et al. | 438/699 |
| 5,004,704 A | 4/1991 | Maeda et al. | 438/624 |
| 5,084,403 A * | 1/1992 | Matsuoka | 257/763 |
| 5,094,984 A | 3/1992 | Liu et al. | 438/760 |
| 5,119,164 A | 6/1992 | Sliwa, Jr. et al. | 257/776 |
| 5,188,987 A | 2/1993 | Ogino | 438/675 |
| 5,192,715 A | 3/1993 | Sliwa, Jr. et al. | 438/631 |
| 5,204,288 A | 4/1993 | Marks et al. | 438/699 |
| 5,244,841 A | 9/1993 | Marks et al. | 438/699 |
| 5,250,472 A | 10/1993 | Chen et al. | 438/699 |
| 5,268,333 A | 12/1993 | Lee et al. | 438/698 |
| 5,278,103 A | 1/1994 | Mallon et al. | 438/632 |
| 5,308,415 A * | 5/1994 | Chou | 438/714 |
| 5,310,700 A | 5/1994 | Lien et al. | 438/618 |
| 5,444,026 A | 8/1995 | Kim et al. | 438/760 |
| 5,468,684 A * | 11/1995 | Yoshimori et al. | 438/3 |
| 5,508,234 A | 4/1996 | Dusablon, Sr. et al. | 438/422 |
| 5,518,962 A | 5/1996 | Murao | 438/624 |
| 5,641,712 A | 6/1997 | Grivna et al. | 438/624 |
| 5,705,838 A * | 1/1998 | Jost et al. | 257/296 |
| 5,773,361 A | 6/1998 | Cronin et al. | 438/637 |
| 5,814,558 A * | 9/1998 | Jeng et al. | 438/623 |
| 5,847,465 A * | 12/1998 | Liou et al. | 257/774 |
| 5,874,756 A * | 2/1999 | Ema et al. | 257/296 |
| 5,880,019 A * | 3/1999 | Hsieh et al. | 438/666 |
| 5,976,972 A * | 11/1999 | Inohara et al. | 438/640 |

FOREIGN PATENT DOCUMENTS

JP  62-144342   6/1987

OTHER PUBLICATIONS

Wolf, Stanley Ph.D., "Silicon Processing for the VLSI ERA," Moss Devices and NMOS Process Integration, vol. II, pp. 332–333, 1986.

* cited by examiner

*Primary Examiner*—Hung Vu
(74) *Attorney, Agent, or Firm*—Schmeiser, Olsen & Watts; William D. Sabo

(57) ABSTRACT

An integrated circuit device including a contact via having a non-cylindrical bottom portion is disclosed. Also a contact via with non-parallel side walls is disclosed. The contact vias are selectively positioned in the integrated circuit device.

8 Claims, 10 Drawing Sheets

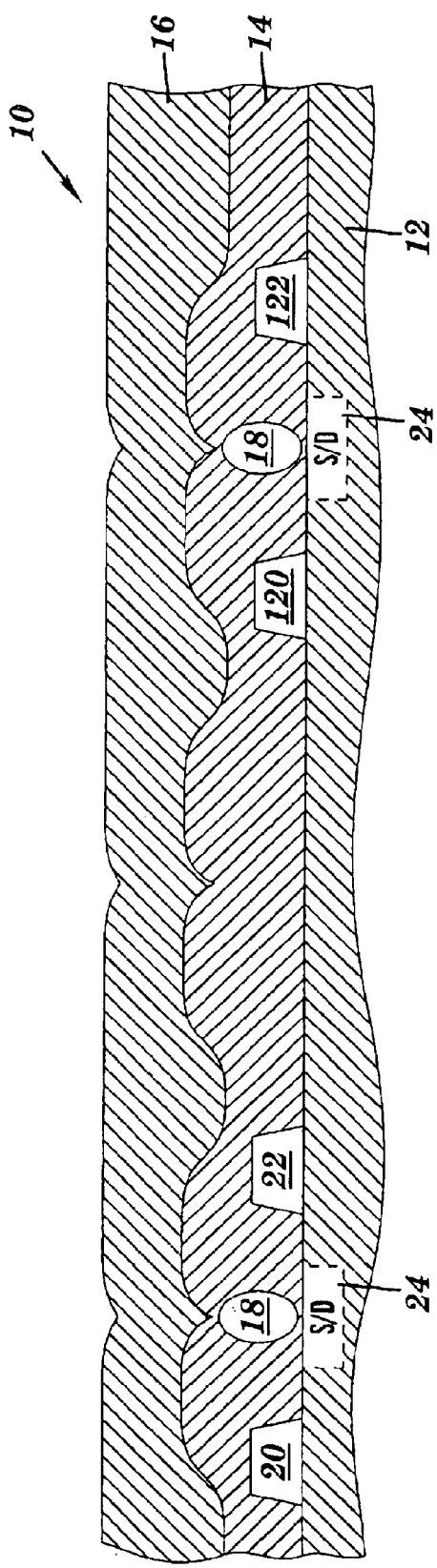
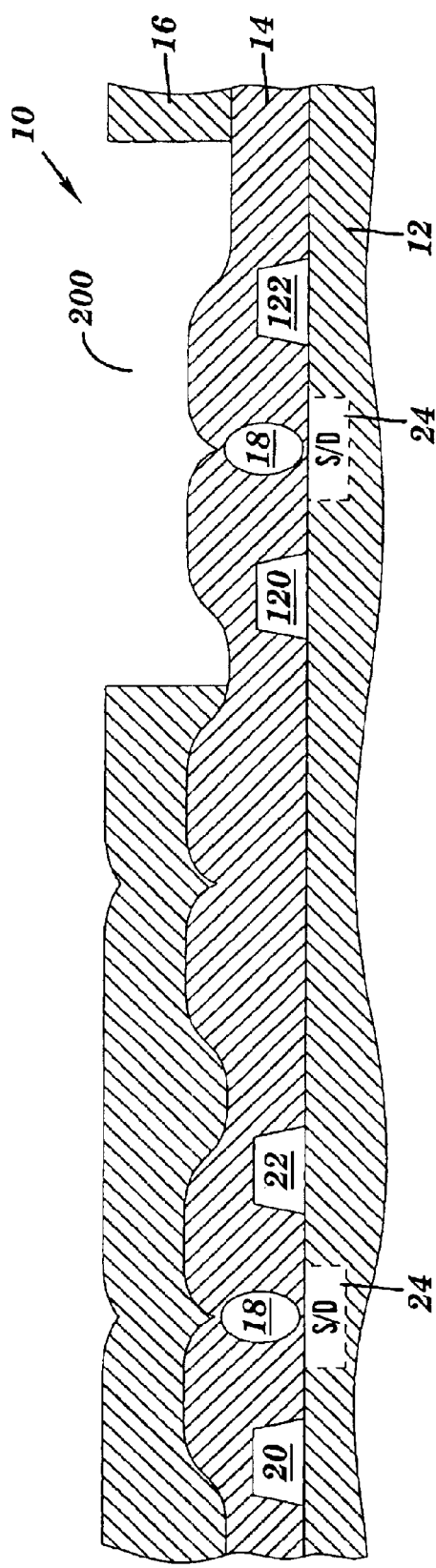
FIG. 7a
FIG. 7b

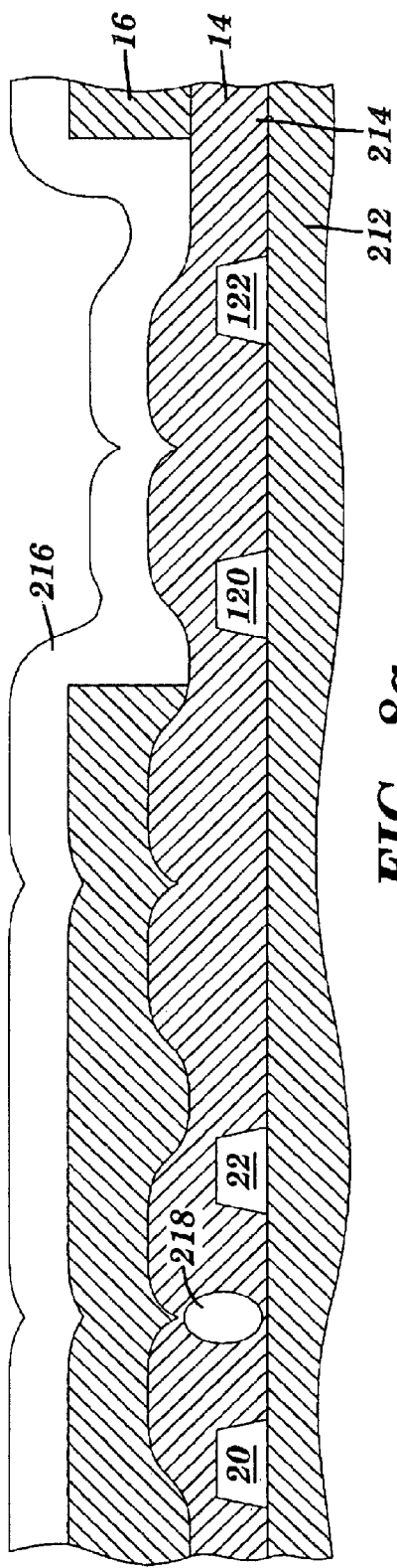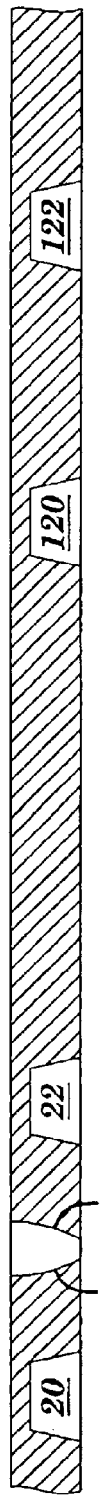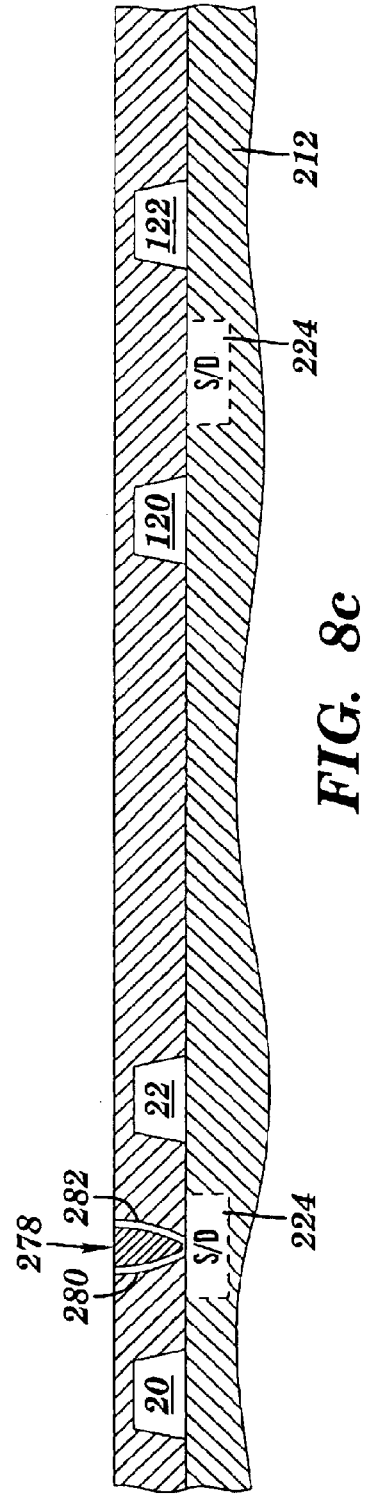
FIG. 8a
FIG. 8b
FIG. 8c

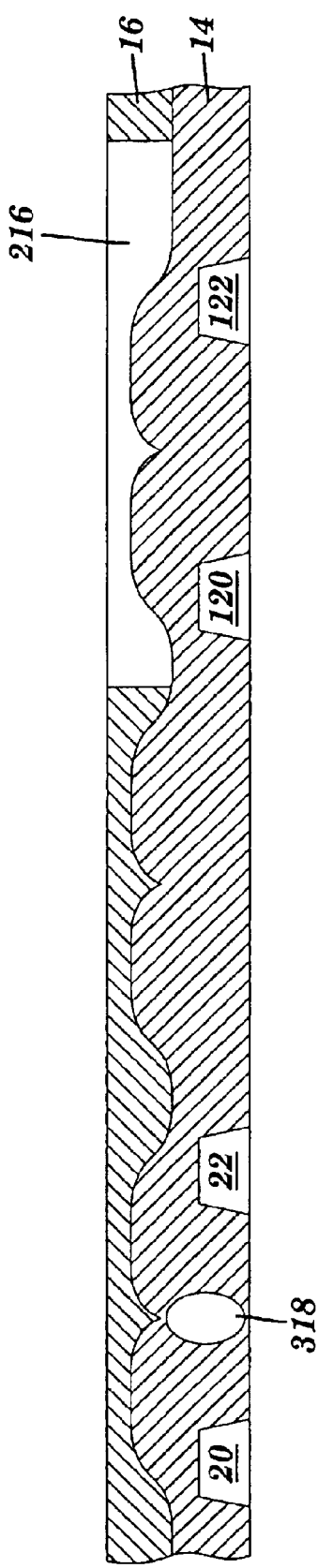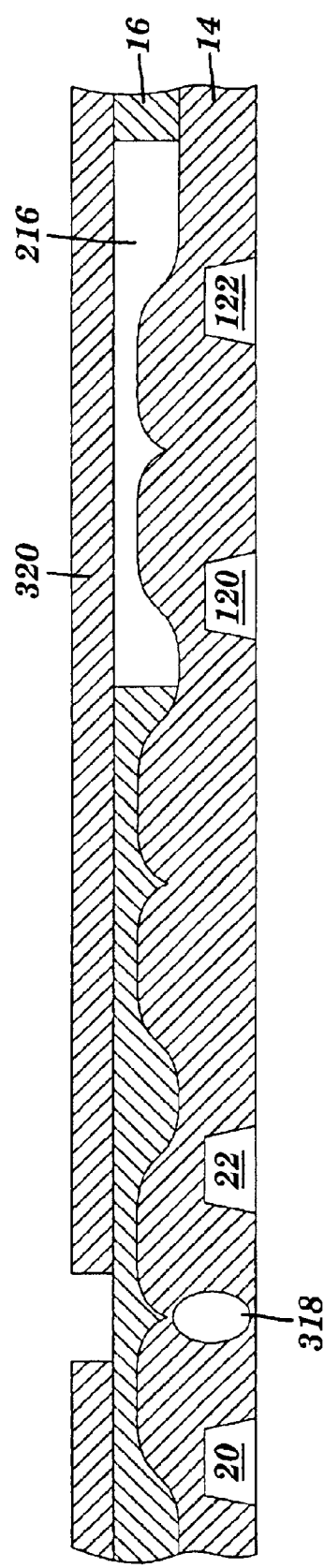

SPECIALLY SHAPED CONTACT VIA AND INTEGRATED CIRCUIT THEREWITH

BACKGROUND OF THE INVENTION

1. Technical Field

This invention relates to integrated circuit devices and a process of making the same, and in particular, this invention relates to microcavity structures which utilize a pinning layer to pin the microcavity structures in selected areas, applications thereof and process of making the same. This invention also relates to the specially shaped contact vias created with the process and the integrated circuit therewith.

2. Related Art

As integrated circuit devices become smaller, spacing between electronic components and conductors becomes ever more critical. Such components and/or conductors are typically separated and isolated by a dielectric material. A vacuum has the best relative dielectric constant (1.0). The dielectric constant of air is just slightly higher than that of a vacuum.

Doped glass is commonly used as an integrated circuit dielectric because its melting point can be made significantly lower than that of regular glass or of other dielectric materials. Boro-Phosphorus Silicate Glass (BPSG) is one exemplary type of doped glass. After deposition over a pattern of polysilicon conductors, for example, a BPSG dielectric layer can be put through a high temperature reflow process, usually at about 900° C., which reflows the BPSG, smooths its surface, and eliminates 'as deposited' voids between the polysilicon conductors for facilitating subsequent processing steps.

A typical BPSG material, however, has a significantly higher relative dielectric constant, e.g., about 3.6 to 4.6. One technique which has been used to reduce the relative dielectric constant of BPSG glass is to allow cavities to form in the material at appropriate locations. The cavities can form during the chemical vapor deposition (CVD) process in spaces between raised features, such as conductors or semiconductor mesas. These cavities are essentially air or vacuum filled and therefore constitute a low dielectric constant region between the raised features. In this manner, for example, capacitive coupling between adjacent conductors can be reduced, thereby enhancing device signal speed.

Despite speed improvements, which voids in BPSG films can provide, their proper size and shape formation is presently difficult to control. For example, voids between adjacent conductors are formed when a BPSG layer is deposited on top of a polysilicon conductive pattern. However, during the reflow process, the voids may disappear if the spaces between polysilicon conductors are large enough or the deposited film is thin enough. The voids formed when a BPSG layer of about 7000 Angstroms is deposited over a circuit topography of conductors separated by about 1.0 micron are typically eliminated during reflow. Unfortunately, it is not possible to forgo the reflow process without also losing the smoothness and related benefits such a structure can provide in subsequent processing.

Thus, as with the above-discussed example, there is a need for an improved method for controllably fabricating cavities for semiconductor and micro-machine applications, such as for pressure sensing, chromatography, fabrication of capacitive components, and selectively isolating components and conductors, etc. Further, there is a need for a method to create self-aligned contact vias which do not short circuit to neighboring conductors. Further there is a need to be able to shape contact vias.

SUMMARY OF THE INVENTION

Microcavity structures or voids are controlled for providing structures, such as self-aligned contact vias, by pinning a microcavity in selected areas using a pinning layer which is then selectively removed. A structure such as the contact via is formed in a method which steps include: providing a layer having a pair of raised features; depositing a void forming material over said layer; depositing a pinning material over said void forming material, wherein the pinning material acts to pin a void in said void forming material; and annealing the materials.

Another method of this invention includes the steps of: providing a substrate with topography; depositing a void forming material over said substrate to thereby form voids; depositing a pinning material over said void forming material wherein the pinning material pins the void forming material; patterning said pinning material to remove the pinning material from areas where void formation is not desired; and annealing the voids in areas where the pinning material remains to seal the void forming material in areas where the second material has been selectively removed.

The contact via and method for making the same saves both time and expense over existing methods. For example, it does not require the use of pressurizing the microcavities to prevent collapse of the microcavity structures. Another advantage is more accurate control of size, shape and location of void formation. Numerous other advantages and features of the method will become readily apparent from the following detailed description of the preferred embodiment, the accompanying drawings and the appended claims.

In another embodiment in accordance with the present invention is provided an integrated circuit device comprising a contact via having a non-cylindrical bottom portion. The integrated circuit device may have either a frustoconical or arrowhead shaped bottom portion.

In a further embodiment, a contact via having non-parallel side walls is provided.

In yet another embodiment in accordance with the present invention is provided a contact via for use in a semiconductor device, the contact via having non-parallel side walls. The contact via may also have either a frustoconical or arrowhead shaped bottom portion.

The above devices allow for contact vias with non-cylindrical shape.

BRIEF DESCRIPTION OF THE DRAWINGS

The preferred exemplary embodiment of the present invention will hereinafter be described in conjunction with the appended drawings, where like designations denote like elements, and:

FIGS. 7a–7c show a process of selectively removing voids in accordance with the present invention;

FIGS. 8a–8c show a process of selectively forming a frustoconical contact via in accordance with the present invention; and FIGS. 9a–9d shows a process of selectively forming a toilet-shaped contact via in accordance with the present invention.

The foregoing and other objects, features and advantages of the invention will be apparent from the following more particular description of preferred embodiments of the invention.

DETAILED DESCRIPTION OF THE PREFERRED EMBODIMENTS

Various types of microcavity formation are described in detail in U.S. Pat. No. 5,508,234, which is assigned to International Business Machines Corp., and is hereby incorporated by reference.

Figure 1:
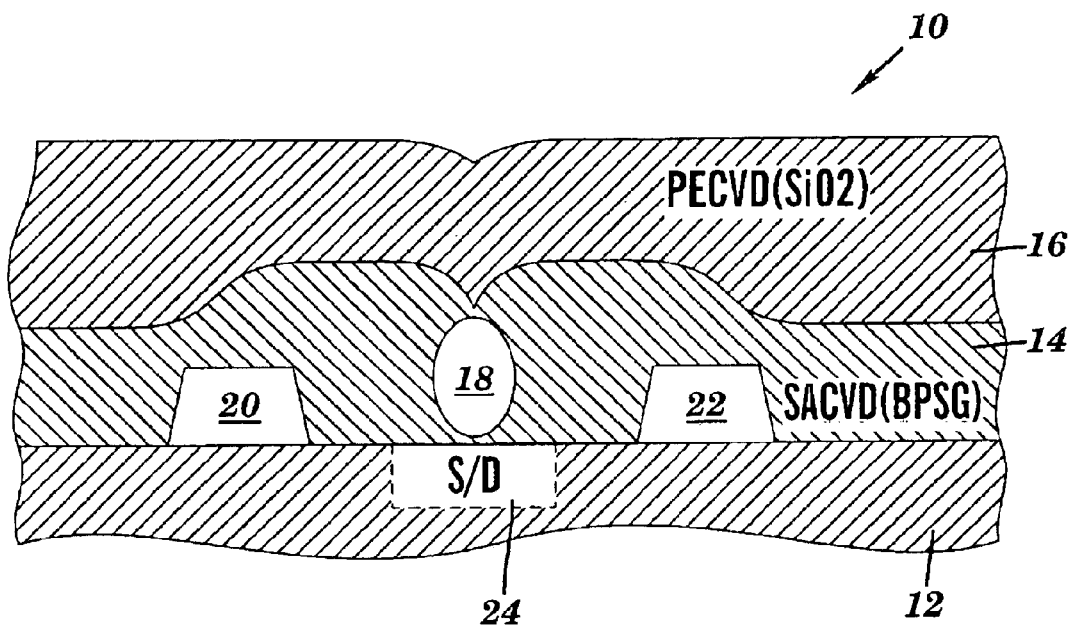
FIG. 1 is a schematic representation of a portion of an integrated circuit (IC) device structure showing a void therein.

Referring to FIGS. 1 and 7a, a layer 12 of, e.g., polysilicon, is provided. The layer 12 may be built up by semiconductor processing steps to include a conductor or source/drain region (S/D) 24. A plurality of raised features 20, 22, 120, 122 such as conductors (e.g., polylines), or semiconductor mesas, having an aspect ratio greater than 2 are then formed on layer 12. The size and shape of the raised features 20, 22, 120, 122 may vary depending upon the particular application and the desired size and shape of the resultant void 18. The raised features 20, 22, 120, 122 are formed such that a layer disposed thereabove would not entirely fill the space therebetween (i.e., a void would be formed). The aspect ratio/pair spacing is critical to determining where the void will form. For instance, as shown in FIG. 7a, the space between raised features 22 and 120 is such that no void 18 is formed therebetween. Accordingly, the positioning of voids 18 can be controlled by the spacing between raised features 20, 22, 120, 122.

A layer or film 14 of material, such as a glass or more particularly Boro-Phosphorus Silicate Glass (BPSG), is deposited over the layer 12 and raised features 20, 22, 120, 122 by a deposition process, such as preferably Sub-atmospheric Chemical Vapor Deposition (SACVD). Other deposition processes may be used such as Plasma Enhanced Chemical Vapor Deposition (PECVD), Liquid Phase Chemical Vapor Deposition (LPCVD), etc. The layer of material 14 is a relatively low density film. Voids 18 are formed between the raised features 20, 22 and 120, 122 in any desired number, shape or geometry, such as microtunnels. Preferably, the layer of material 14 is deposited to a thickness of greater than 0.5 of the space between the pair of raised features.

Figure 7C:
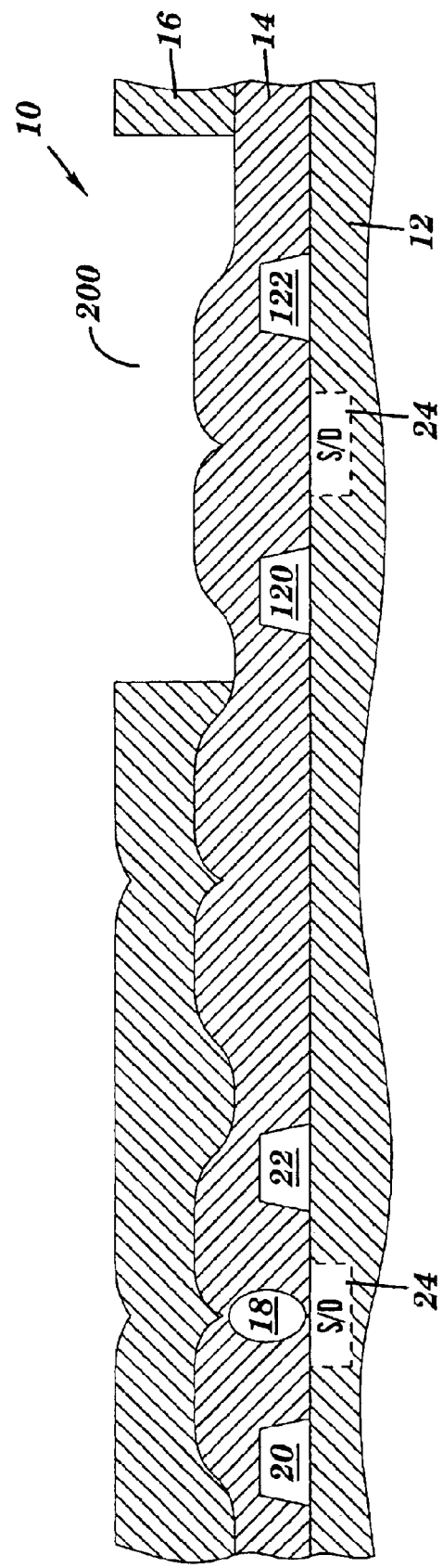

Care should be taken to ensure that during the anneal step the relatively low density material 14 does not contract. During annealing the material 14 tends to contract (e.g., relatively low density BPSG tends to contract by about 3%), resulting in the void moving toward the top of a surface of the layer 14 one vacancy at a time (literally one atom at a time). This may result in the undesired effect of elimination of the void 18. Thus, in order to determine the desired void shape and geometry of void 18, a layer of pinning material 16 is deposited over the layer 14 before annealing. The pinning layer 16 changes the shape of the void. The preferred annealing step is a Rapid Thermal Anneal (RTA). The layer 16 is formed from a relatively high density material such as silicon dioxide ($SiO_2$), phosphorous doped $SiO_2$, boron phosphorous doped $SiO_2$, or any material which would shrink less than the layer 14 during the anneal, adheres well to the layer 14, and is fairly rigid such that it does not expand or shrink during the anneal relative to layer 14. Such materials include sputtered silicon, silicon nitride, CVD or sputtered metal. The layer 16 is deposited by a deposition process, such as Plasma Enhanced Chemical Vapor Deposition (PECVD). As shown in FIGS. 7b and 7c, the material 16 may be selectively removed, by lithographically patterning and etching above the raised portions or polysilicon lines, to form open areas 200 above chosen voids, hence, selectively removing chosen voids 18 as the voids 18 rise through layer 14 during the anneal, i.e., through void diffusion.

Figure 2:
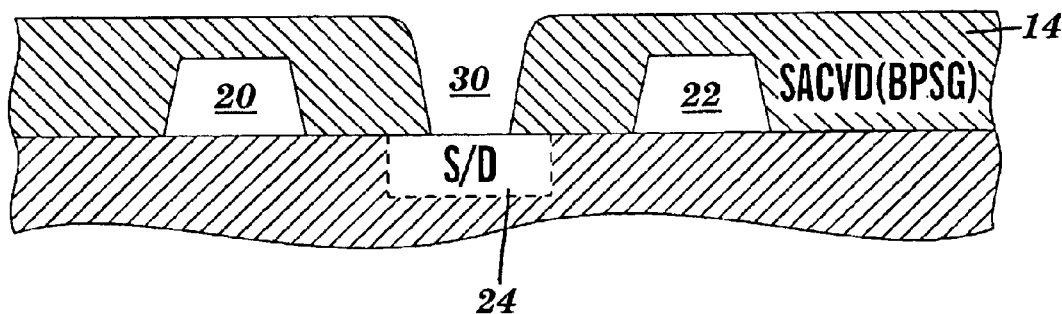
FIG. 2 is a schematic representation of a portion of the IC device of FIG. 1 after etching the void region.

Referring to FIG. 2, a self-aligned contact via 30 is shown between the raised features 20, 22.

Figure 3:
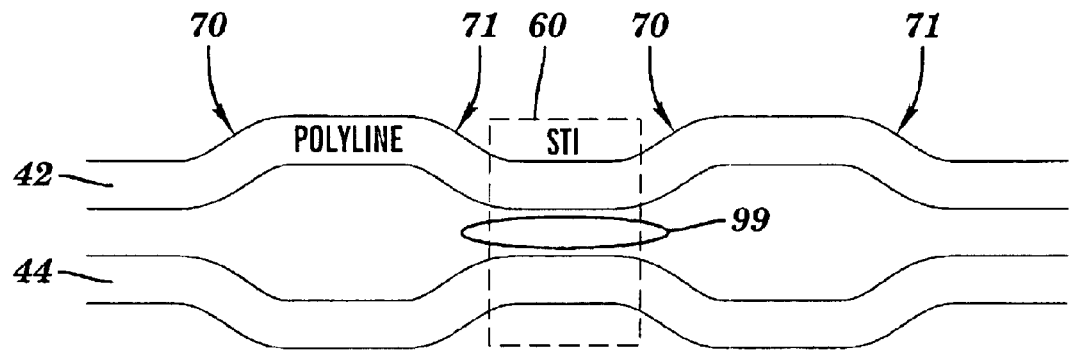
FIG. 3 is a top view of the IC before anneal.
Figure 4:
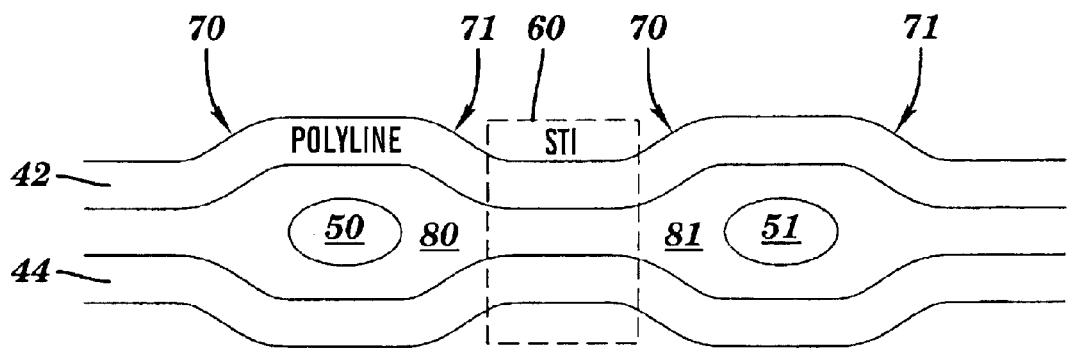
FIG. 4 is a top view of the IC after anneal.

Referring to FIGS. 3 and 4, a top view of a self-aligned contact via is shown in which void creation/movement is illustrated. In the case of a self-aligned contact via, the raised features may include, for example, a word line or gate 42 and 44, formed from a material such as polysilicon, which form parallel lines which diverge at 70 to form a semicircular like configuration and then converge at 71 to resume as parallel lines. If the aspect ratio is sufficiently high (2), a void 99 is formed during BPSG deposition. During anneal, if a pinning layer is over the BPSG, the voids 50, 51 are formed so that they coalesce to, i.e., move towards, the contact regions 80, 81. The contact regions 80, 81 are sized to allow a void to exist. Although other techniques are contemplated, the pinning layer 16 is only on top of the contact regions 80, 81. The pinning layer 16 is lithographically patterned over the contact regions 80, 81. The material is etched through the top two layers 16, 14 down to expose the voids 50, 51, then down to the source/drain region 24 as will be more fully discussed infra.

Referring now to FIGS. 2 and 5a–6d, the specially shaped contact vias 88, 188 and the dielectric 10, 110 in which they can be formed by the above processes are shown. As illustrated in the figures, the contact via areas 78, 178 in accordance with the present invention have non-parallel side walls 80, 82, 180, 182.

Figure 5A:
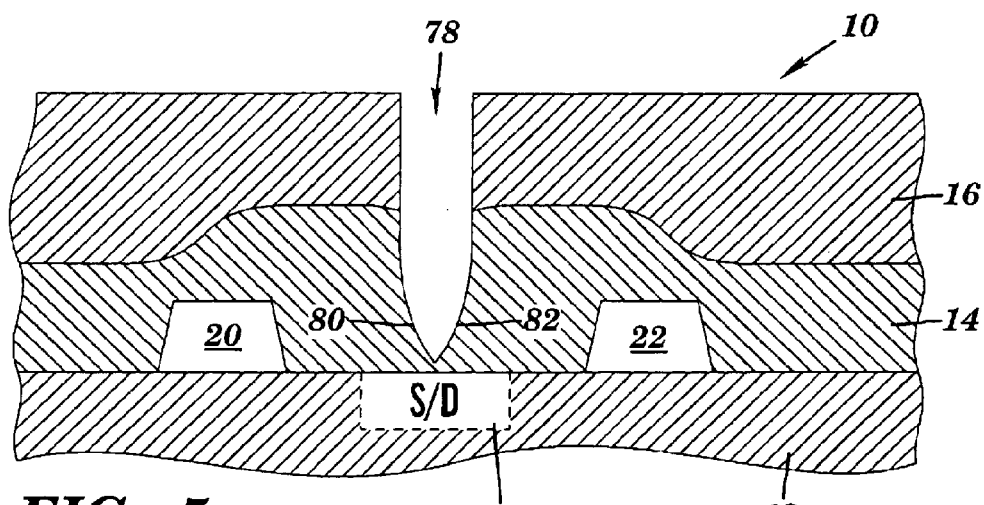
FIGS. 5a–5c show an IC device including a frustoconical contact via in accordance with the present invention.
Figure 5B:
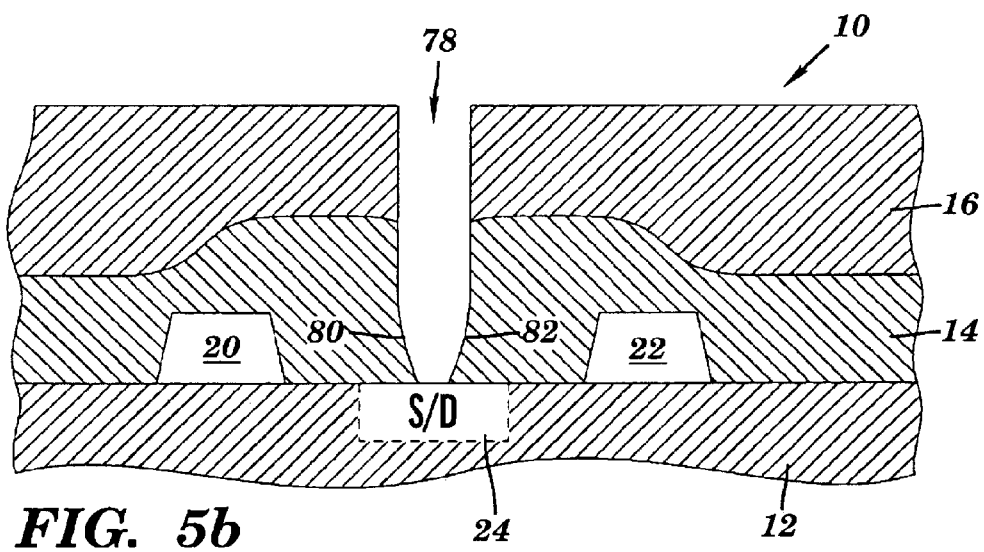
Figure 5C:
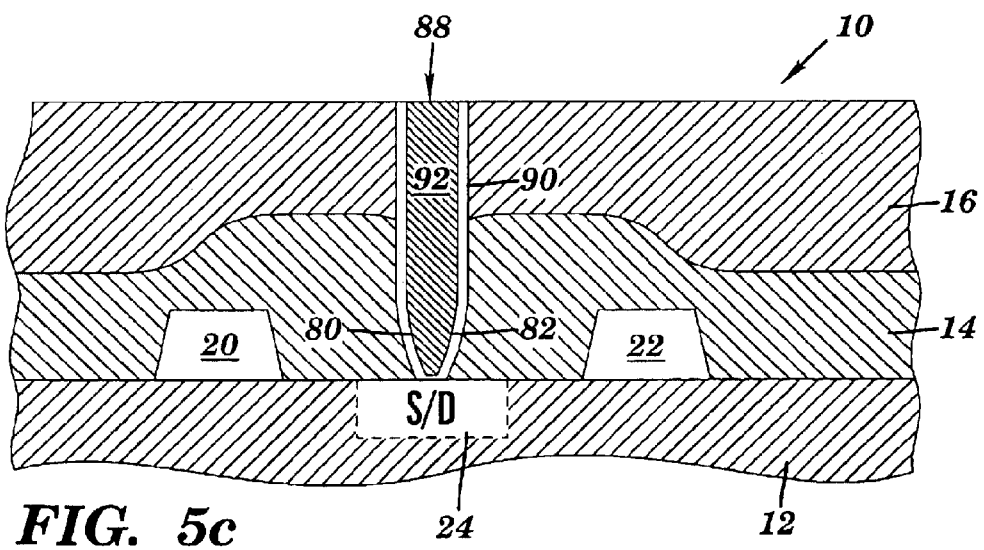

In a first preferred embodiment, as shown in FIGS. 2 and 5a–5c, the void 18 has been opened to provide a contact via areas 30, 78 having a frustoconical bottom portion. The upper portion of the contact via areas can be constructed to be cylindrical and can extend through a number of layers, e.g., layers 14, 16, as shown in FIGS. 5a–5c. The contact via areas 30, 78 shown extend between the raised features or polylines 20, 22. However, the contact via area 78 may be selectively provided anywhere desired in accordance with the above-identified process.

FIGS. 5a and 5b also illustrate how the contact via 88 may be opened at the bottom-most portion, i.e., above the S/D region 24, to provide a variety of differing size openings. For instance, the contact via area 78 may extend downwardly to a point contact as shown in FIG. 5a and be almost conical in shape, or it may be opened to a broader surface as shown in FIG. 5b, the process of creating of which will be discussed later.

Once the contact via area 78 has been sized and shaped as desired, it may be provided with a liner 90 of a titanium-based conductor, such as titanium nitride, titanium with an overlay of titanium nitride, tantalum nitride, tantalum nitride with an overlay of tantalum, or other permutations. Preferably titanium nitride is used. Finally, the contact via area 78 is filled with a conductive material 92 to provide the completed contact via 88 as shown in FIG. 5c. The conductive material 92 can be any conductive material known in the art, such as tungsten, copper or aluminum either in pure form or in an alloy form.

Figure 6A:
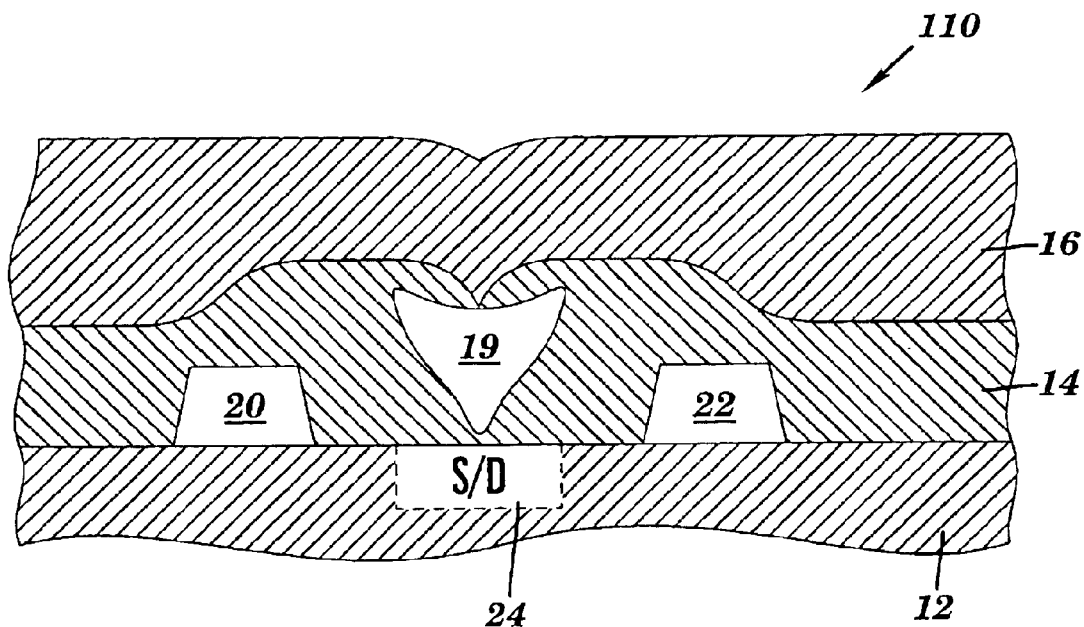
FIGS. 6a–6d show an IC device including an arrowhead-shaped of a contact via in accordance with the present invention.
Figure 6B:
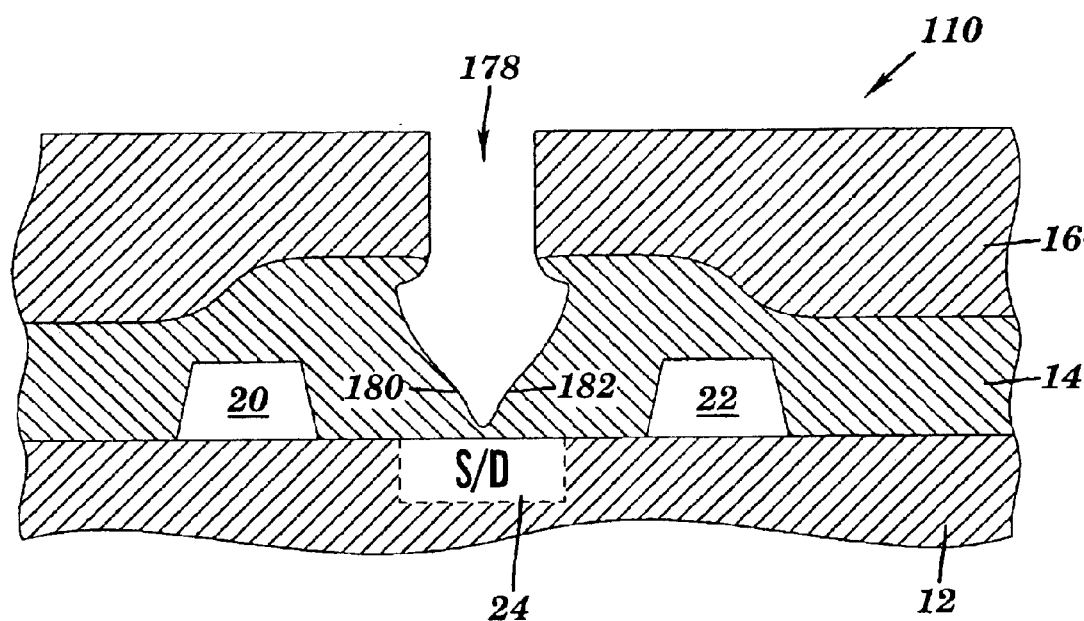
Figure 6C:
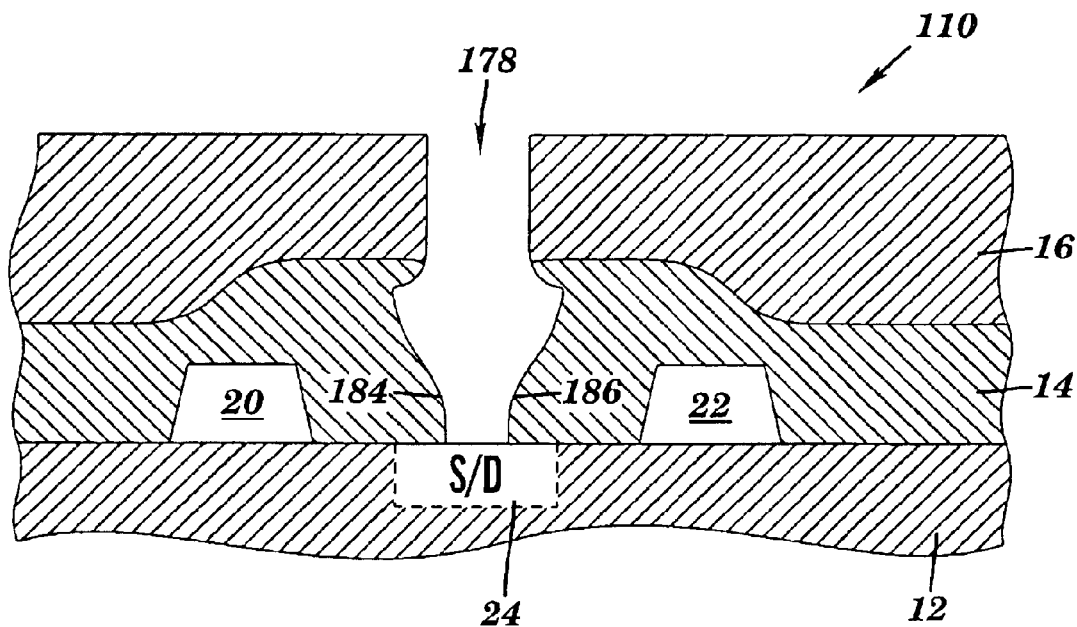

FIGS. 6a–6d illustrate a second preferred embodiment in which the contact via 188 has an arrowhead or heart shaped bottom portion. An arrowhead shape is the general shape of a triangle but having a third side extend inwardly upon itself at its midpoint with a linear member extending outwardly from that midpoint. In this embodiment, the void 19 has a heart shape rather than an oval shape 18. The side walls 180, 182 diverge upwardly and then converge inwardly towards the center of the via. As with the first embodiment, the contact via area 178 may also have a cylindrical upper portion and differing size openings above the S/D region 24 created by etching back the bottom portion of the voids to increase the separation between the bottom of side walls 184, 186 as shown in FIG. 6c. (This would be done prior to creation of the S/D region 24 so as to prevent duplication of processes). Further, the contact via may extend between the raised portions or polylines 20, 22, or be placed anywhere desired in accordance with the above process.

Figure 6D:
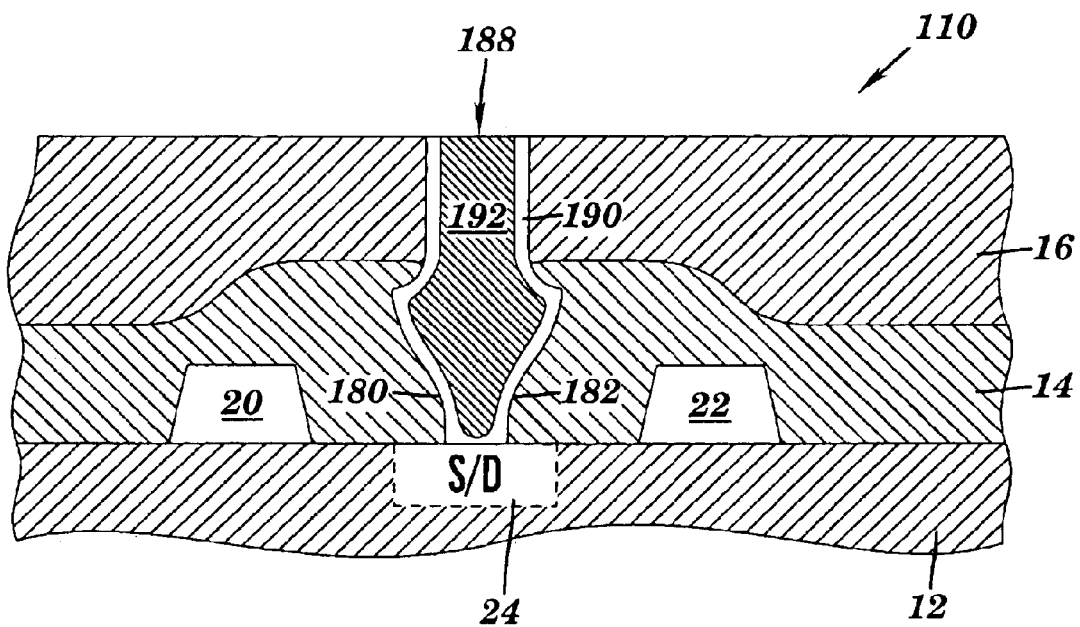

Also similar to the first embodiment, the completed contact via 188 may include a titanium-based conductor liner 190 of, for example, titanium nitride. The contact via 188 is filled with a conductive material 192 as shown in FIG. 6d. Again, the conductive material may be any conductive material known in the art.

Referring to FIGS. 8a–8c, a second process of creating frustoconically shaped contact vias 78, 178 is shown. In this process, as shown in FIG. 8a, a second pinning material 216 may be deposited across the layers 12, 14, 16 as shown in FIG. 7c, i.e., after anneal to remove selective voids, to further aid in maintaining the selectively created void 218. Then, as shown in FIG. 8b, both pinning layers 16, 216 are etched and/or planarized to remove the layers 16, 216. The bottom layer 212 may also be etched and/or planarized to the bottom portion of the void 218 and, hence, create a frustoconical bottom. Next, the layer 212 is replaced and the S/D regions 224 are created according to conventional processes. The resulting void 278 can then be filled as discussed above. The resulting void exhibits a frustoconical shape as shown in FIG. 8c.

Figure 9C:
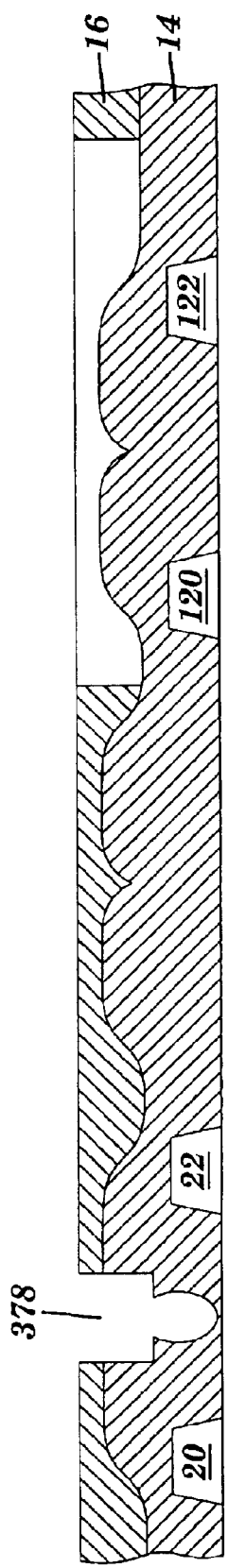
Figure 9D:
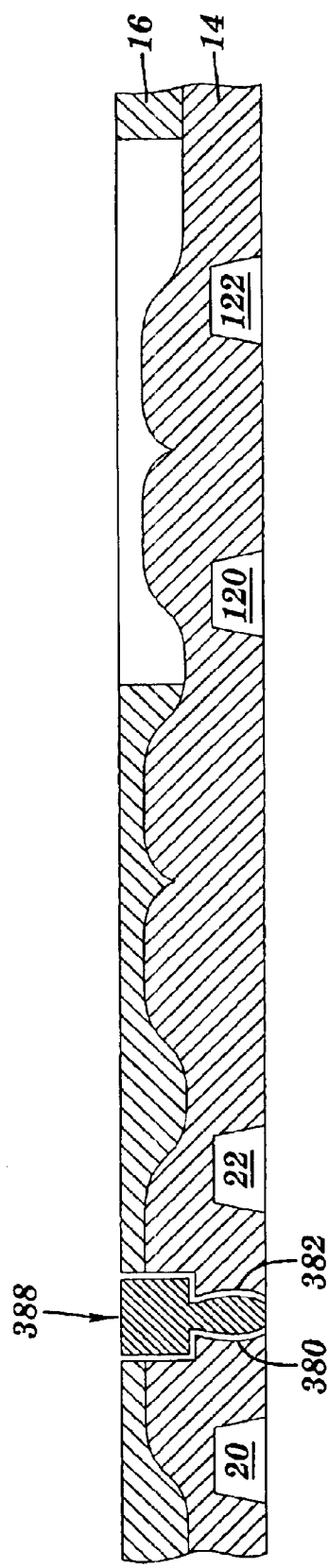

Referring to FIGS. 9a–9d, a process of creating a contact via having a substantially oval bottom with a rectangular or square top portion, is shown. As shown in FIG. 9a, the wafer of FIG. 8a has been planarized to level the first pinning layer 16 and second pinning layer 216. At this stage, a layer of photoresist 320 is laid upon the wafer except over the void 318, as shown in FIG. 9b. An etching step follows, as shown in FIG. 9c, which opens the void 318 and contact via area 378 removes the photoresist 320, and thus forms the oval with rectangular top shaped opening. As shown in FIG. 9d, this contact via 388 may also include an etch back step for the bottom of the wafer to form the frustoconical bottom of the contact via 380, 382. As also shown in FIG. 9d, the contact via 388 may be filled with conductive material and lined as discussed above with the other embodiments.

Those skilled in the art will understand from the above discussion that many other implementations of the various applications are possible, and within the scope of the present invention as defined by the appended claims.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit of the invention.

What is claimed is:

1. An integrated circuit device comprising:

a substrate layer;

a plurality of raised features on said substrate layer, said raised features having an aspect ratio;

a microcavity layer on said substrate layer, said microcavity layer containing at least one microcavity, said microcavity defined by said raised features and surrounded by said microcavity layer;

a pinning layer on said microcavity layer, said pinning layer covering the microcavity layer and the at least one microcavity.

2. The integrated circuit device of claim 1, wherein the microcavity is adapted to receive a conductive material.

3. The integrated circuit device of claim 1, wherein the microcavity is adapted to receive a liner.

4. The integrated circuit device of claim 3, wherein the liner is made of a titanium-based conductor.

5. The integrated circuit device of claim 3, wherein the microcavity is adapted to receive a conductive material.

6. The integrated circuit device of claim 1, further comprising at least a pair of polylines between which the microcavity extends.

7. The integrated circuit device of claim 6, further comprising at least a pair of polysilicon lines between which the microcavity extends.

8. The integrated circuit device of claim 1, wherein the aspect ratio is greater than 2.

\* \* \* \* \*